United States Patent [19]
Kwon et al.

[11] Patent Number: 5,852,311
[45] Date of Patent: Dec. 22, 1998

[54] NON-VOLATILE MEMORY DEVICES INCLUDING CAPPING LAYER CONTACT HOLES

[75] Inventors: Ki-ho Kwon; Dong-soo Jang, both of Kyungki-do, Rep. of Korea

[73] Assignee: Samsung Electronics Co., Ltd., Kyungki-do, Rep. of Korea

[21] Appl. No.: 869,703

[22] Filed: Jun. 5, 1997

[30] Foreign Application Priority Data

Jun. 7, 1996 [KR] Rep. of Korea .................. 1996-20360

[51] Int. Cl.$^6$ .................................................. H01L 29/788

[52] U.S. Cl. .......................... 257/315; 257/316; 257/380; 257/538; 257/904

[58] Field of Search ..................................... 257/314, 315, 257/316, 324, 379, 380, 381, 411, 413, 538, 904

[56] References Cited

U.S. PATENT DOCUMENTS 4,367,580  1/1983  Guterman ................................... 29/571

*Primary Examiner*—Minh-Loan Tran
*Attorney, Agent, or Firm*—Myers Bigel Sibley & Sajovec

[57] ABSTRACT

A non-volatile memory device includes a substrate having memory cell and peripheral circuit regions thereof. A non-volatile memory cell gate on a memory cell region of the substrate includes a floating gate on the substrate, a first insulating gate on the floating gate opposite the substrate, and a control gate on the first insulating layer opposite the floating gate. A resistor layer is provided on a peripheral circuit region of the substrate, and the second insulating layer is provided on the resistor layer opposite the substrate. In addition, a capping layer is provided on the second insulating layer opposite the resistor layer wherein a contact hole is defined by the second insulating layer and the capping layer thereby exposing a portion of the resistor layer. Related methods are also discussed.

10 Claims, 6 Drawing Sheets

|← MEMORY CELL REGION →|←→|← PERIPHERAL CIRCUIT REGION →|

NON-VOLATILE MEMORY DEVICES INCLUDING CAPPING LAYER CONTACT HOLES

FIELD OF THE INVENTION

The present invention relates to the field of integrated circuits, and more particularly to integrated circuit memory devices and methods.

BACKGROUND OF THE INVENTION

A non-volatile memory device can retain stored data in the absence of electrical power. Non-volatile memory devices generally include a plurality of memory cells wherein each memory cell stores one bit of data. A memory cell of a non-volatile memory device may include a single transistor with a gate electrode including a floating gate, a control gate, a source, and a drain. The floating gate is used to store a bit of data, and the control gate controls the floating gate.

An erase operation can be performed on a non-volatile memory cell by extracting electrons from the floating gate thereby reducing a threshold voltage $V_{TH}$ of the memory cell transistor. A program operation can be used to increase the threshold voltage of a non-volatile memory cell by injecting hot channel electrons into the floating gate. A read operation can be performed on a non-volatile memory cell to thereby determine whether the memory cell has been most recently erased or programmed.

The voltage applied to a memory cell during program and erase operations is determined in part by a resistor in a peripheral circuit region of the memory device. This resistor can be formed from a conductive layer such as polysilicon, so that its resistance can be determined by the size and doping concentration of the conductive layer. A method for forming a polysilicon resistor for a non-volatile memory device is discussed for example in U.S. Pat. No. 4,367,580 entitled "Process For Making Polysilicon Resistors" to Guterman and assigned to Texas Instruments Incorporated. This patent is hereby incorporated herein in its entirety by reference.

Capping layers formed according to methods of the prior art, however, may leave surface portions of the polysilicon resistor layer uncovered adjacent edges thereof. A stringer in the form of a spacer may thus remain on sidewalls of the polysilicon resistor after the etch step used to pattern the capping layer. In other words, portions of the layer used to form the capping layer may be incompletely removed from sidewalls of the resistor layer. The stringers may result because an anisotropic etch used to pattern the capping layer may not completely etch the capping layer at the sidewalls of the resistor layer. The resulting stringers may thus act as a particle source during subsequent processing thereby reducing manufacturing yields.

Figure 5A:
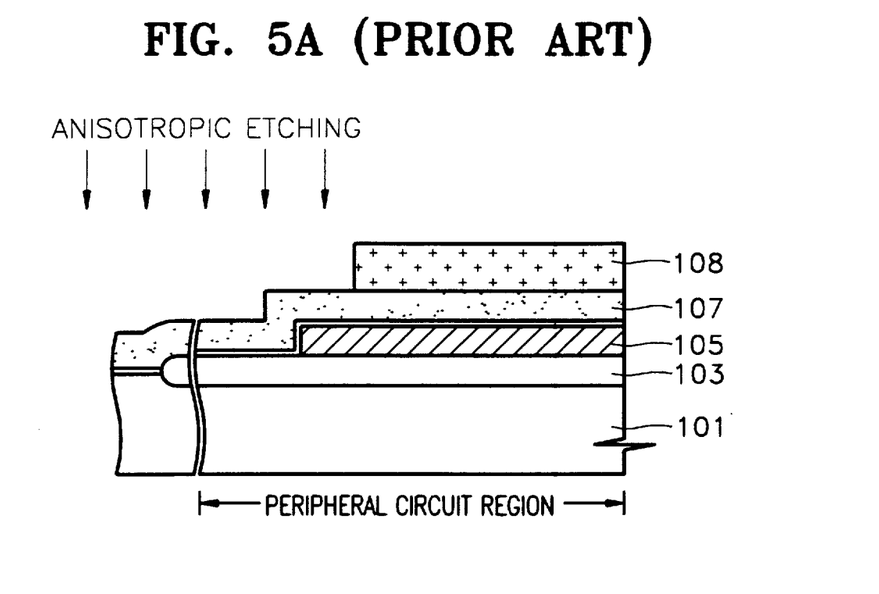
FIGS. 5A and 5B are cross sectional views illustrating steps of a method for forming a capping layer according to the prior art.
Figure 5B:
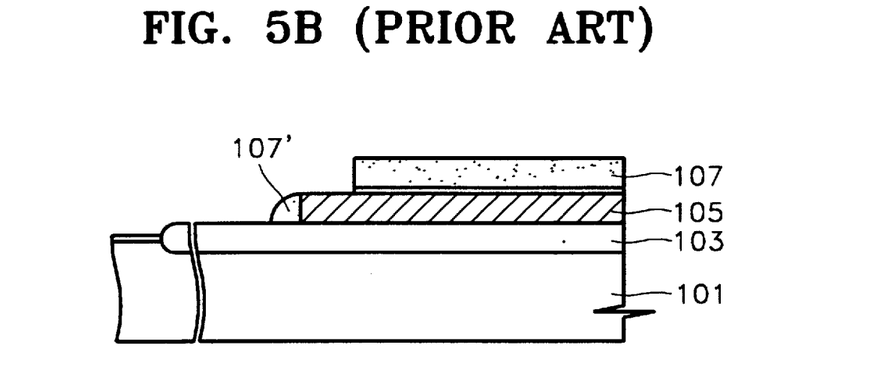

As shown in FIGS. 5A and 5B, the peripheral circuit region of a device includes a substrate 101, a field oxide layer 103, a resistor layer 105, and a capping layer 107. The photoresist layer 108 is used to pattern the capping layer 107 and then removed. As shown, in FIG. 5B, a stringer 107 may remain along a sidewall of the resistor layer 105.

Notwithstanding the above-mentioned structures, there continues to exist a need in the art for improved non-volatile memory devices and methods.

SUMMARY OF THE INVENTION

It is therefore an object of the present invention to provide improved non-volatile memory devices and methods.

It is still another object of the present invention to improve manufacturing yields for non-volatile memory devices.

These and other objects are provided according to the present invention by a non-volatile memory device including a substrate having memory cell and peripheral circuit regions, a non-volatile memory cell gate, a resistor layer, a second insulating layer, and a capping layer. In particular, the non-volatile memory cell gate is on a memory cell region of the substrate, and the memory cell gate includes a floating gate on the substrate, a first insulating layer on the floating gate opposite the substrate, and a control gate on the first insulating layer opposite the floating gate. The resistor is on a peripheral circuit region of the substrate, and the second insulating layer is on the resistor layer opposite the substrate. The capping layer is on the second insulating layer opposite the resistor, and a contact hole is defined by the second insulating layer and the capping layer exposing a portion of the resistor layer.

The capping layer can thus extend completely across the resistor layer so that the capping layer covers the resistor layer to edge portions thereof except for the portion of the resistor layer exposed by the contact hole. Alternately, the capping layer can extend completely across the resistor layer and edge portions thereof so that the capping layer covers the resistor layer and sidewalls thereof except for the portion of the resistor layer exposed by the contact hole. Accordingly, the capping layer can reduce undesired doping of the resistor layer, and the generation of stringers along the sidewalls of the resistor layer can be reduced. In other words, exposure of the resistor layer sidewalls can be reduced when using a capping layer according to the present invention.

The non-volatile memory device can also include a third insulating layer and a metal layer. The third insulating layer can be provided on the capping layer opposite the second insulating layer wherein the third insulating layer defines a second contact hole therein through the first contact hole exposing a sub-portion of the exposed portion of the resistor layer. A metal layer is provided on the third insulating layer opposite the capping layer wherein the metal layer is electrically connected to the resistor layer through the contact hole. Metal interconnections can thus provide electrical connection to the resistor layer.

The capping layer can extend beyond the resistor layer thereby covering sidewalls of the resistor layer, or edges of the capping layer can coincide with edges of the resistor layer. In either case, the surface of the resistor layer is covered by the capping layer with the exception of the portions exposed through the contact hole.

In addition, the floating gate layer and the resistor layer can be formed from doped polysilicon layers having a common resistivity and a common thickness. The first and second insulating layers may each include oxide/nitride/oxide (ONO) layers. In addition, the control gate layer and the capping layer can be formed from doped polysilicon layers having a common resistivity and a common thickness. The control gate layer and the capping layer may also include metal silicide layers on the doped polysilicon layers.

According to an alternate aspect of the present invention, a method for forming a non-volatile memory device may include the steps of forming a floating gate on a memory cell region of a substrate, forming a first insulating layer on the floating gate opposite the substrate, and forming a control gate on the first insulating layer opposite the floating gate. A resistor layer is formed on a peripheral circuit region of the substrate, and a second insulating layer is formed on the resistor layer opposite the substrate. A capping layer is formed on the second insulating layer opposite the resistor layer, and a contact hole is formed in the second insulating layer and the capping layer thereby exposing a portion of the resistor layer.

According to the non-volatile memory devices and methods of the present invention, a capping layer on a resistor layer can be used to reduce undesired doping of the resistor layer thereby maintaining a desired resistance of the resistor layer. In addition, the use of the capping layer of the present invention can reduce residues of conductive material on the sidewalls of the resistor layer which may result when forming the capping layer. Accordingly, the generation of stringers can be reduced.

DETAILED DESCRIPTION

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout. It will also be understood that when a layer is referred to as being "on" another layer or substrate, it can be directly on the other layer or substrate, or intervening layers may also be present.

Figure 1:
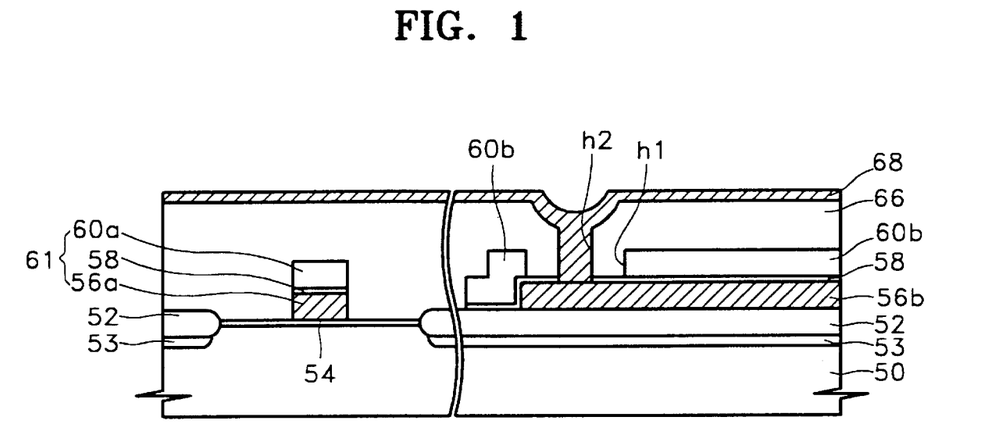
FIG. 1 is a cross sectional view illustrating a first non-volatile memory device according to the present invention.
Figure 2:
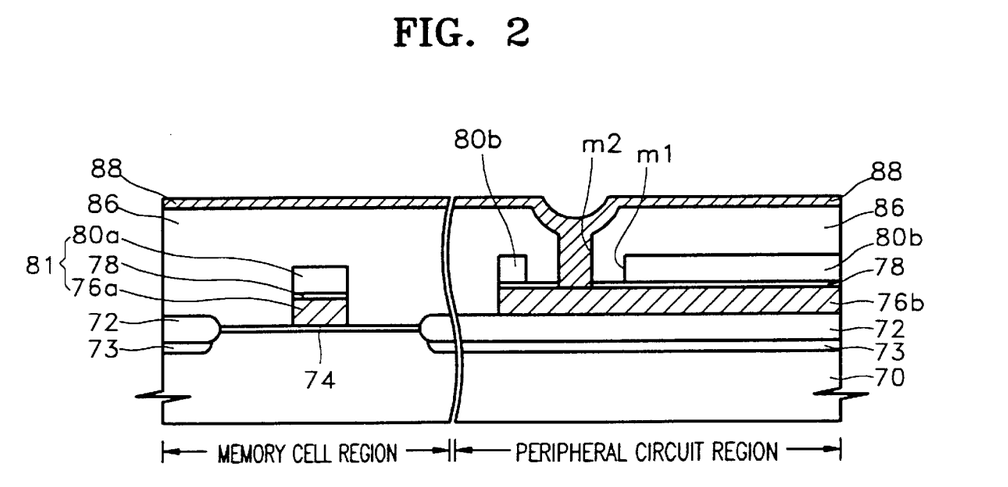
FIG. 2 is a cross sectional view illustrating a second non-volatile memory device according to the present invention.

Non-volatile memory devices according to the present invention are illustrated in FIGS. 1 and 2. In FIG. 1, the memory device includes a gate 61 formed in a memory cell region of a semiconductor substrate 50. The gate 61 includes a floating gate 56a, an insulating layer 58, and a control gate 60a. The memory device also includes a peripheral circuit region of the substrate 50 where a resistor layer 56b is formed from the same conductive layer used to form the floating gate 56a. The capping layer 60b is formed from the same conductive layer used to form the control gate 60a, and the insulating layer 58 is provided between the resistor layer and the capping layer.

As shown, the capping layer 60b covers a larger area than the resistor area 56b so that the capping layer extends over sidewalls of the resistor layer. In addition, a contact hole $h_1$ is formed in the capping layer 58 exposing a portion of the resistor layer 56b. An interlayer dielectric layer 66 is formed on the capping layer 60b, and a contact hole through the interlayer dielectric layer 66 exposes a portion of the resistor layer 56b through the first contact hole $h_1$. A metal layer 68 on the interlayer dielectric layer 66 is connected with the resistor layer 56b through the contact holes $h_1$ and $h_2$.

In FIG. 2, the gate 81 is formed in the memory cell region of the semiconductor substrate 70, and the gate 81 includes a floating gate 76a, an insulating layer 78, and a control gate 80a. The substrate 80 also includes a peripheral circuit region wherein a resistor layer 76b is formed from the same conductive layer used to form the floating gate. An insulating layer 78 is formed on the resistor layer, and a capping layer 80b is formed on the insulating layer. As shown, the capping layer 80b has a surface area equal to that of the resistor layer 76b. In other words, the edges of the capping layer and the resistor layer coincide. A contact hole $m_1$ is formed in the capping layer 80b exposing a portion of the resistor layer 76b. An interlayer dielectric layer 86 is formed on the capping layer 80b and a second contact hole $m_2$ is formed in the interlayer insulating layer 86 thereby exposing a portion of the resistor layer 76b through the first contact hole $m_1$.

In the devices of both FIGS. 1 and 2, field oxide layers 52 and 72 can be used to define active and isolation regions of the substrate. As shown, the memory cell regions may coincide with active regions of the substrate, and the peripheral circuit regions may coincide with isolation regions of the substrate. In addition, channel stop regions 53 and 73 can be formed in the substrates beneath the field oxide layers 52 and 72. In FIGS. 1 and 2, the capping layers both cover the respective resistor layers. In FIG. 1, the capping layer extends beyond the resistor layer covering the sidewalls thereof. In FIG. 2, the capping layer extends to the edges of the resistor layer. Accordingly, the resistor layers of FIGS. 1 and 2 are not exposed when the second conductive layer is patterned to form the capping layers 60b and 80b. Conductive residues on the sidewalls of the resistor layer can thus be reduced.

Figure 3A:
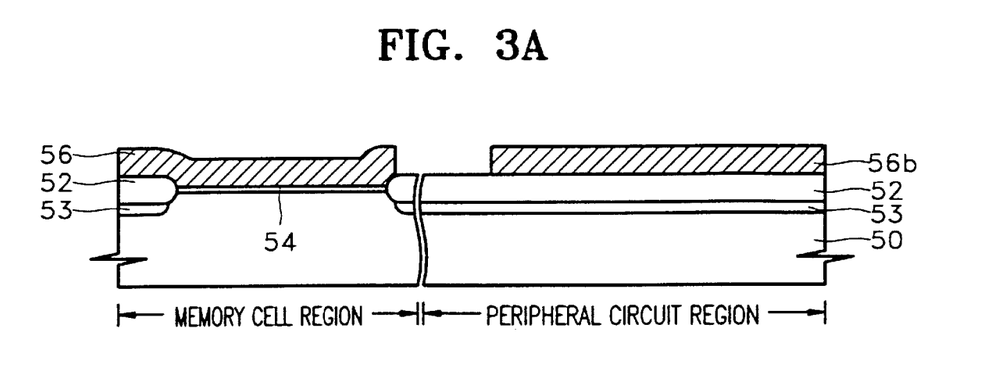
FIGS. 3A to 3E are cross sectional views illustrating steps of a method for forming a non-volatile memory device according to FIG. 1.

FIGS. 3A through 3E are cross-sectional views illustrating steps of a method for forming a non-volatile memory device according to FIG. 1. As shown in FIG. 3A, a field oxide layer 52 defines the active and isolation regions of the substrate 50. For example, a p-type semiconductor substrate can have a memory cell region and a peripheral circuit region wherein the peripheral circuit region is covered by the field oxide layer 52 and a portion of the memory cell region is not covered by the field oxide layer 52. A gate oxide layer 54 can then be formed on the active region of the substrate using a conventional thermal oxidation technique. A first conductive layer can then be formed by depositing a conductive material such as polysilicon on the gate oxide layer 54 and on the field oxide layer 52. A desired conductivity for the first conductive layer can be provided by ion implantation. Moreover, the first conductive layer 56 can be patterned to form a floating gate and a resistor layer for the memory device. In particular, the portion of the conductive layer on the peripheral circuit region can be patterned to form the resistor layer 56b.

A channel stop layer 53 can be provided under the field oxide layer 52. This channel stop layer can include a $P^+$ channel stop layer under the field oxide layer 52. This channel stop layer can be formed by ion implantation prior to the formation of a field oxide layer. In addition, the gate oxide layer 54 can be formed using known thermal oxidation techniques such as dry oxidation. Moreover, the gate oxide layer 54 can have a thickness of approximately 90 Angstroms, and the first conductive layer can be a layer of polysilicon having a thickness of approximately 1,500 Angstroms deposited using a low-pressure chemical vapor deposition (LPCVD) technique. The resistivity of the first conductive layer can be determined by the dose of an implant used to dope the first conductive layer. For example, a dopant such as phosphorous can be implanted into the first conductive layer to provide a sheet resistance of approximately 55 ohms/cm$^2$.

Figure 3B:
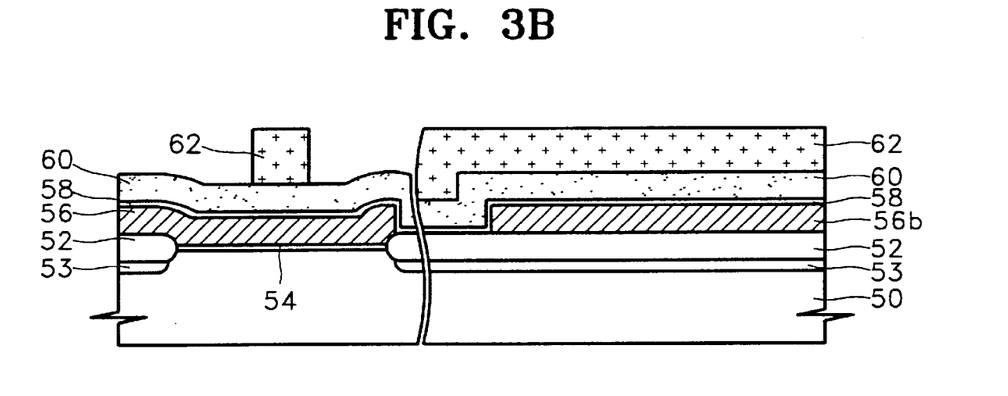

In FIG. 3B, an insulating layer 58 is formed on the first conductive layer, and a second conductive layer 60 is formed on the insulating layer 58. The insulating layer 58 can be an oxide/nitride/oxide (ONO) layer deposited on the first conductive layer and exposed portions of the field oxide layer. The second conductive layer 60 can be formed by depositing a conductive material on the insulating layer 58. A photoresist pattern 62 can then be formed by coating photoresist on the second conductive layer 60 and patterning the photoresist coat using a photolithography step.

The photoresist pattern 62 can be used as an etch mask when forming the control gate 60a for the memory cell transistor. As shown, the photoresist pattern 62 also covers the peripheral circuit region. In particular, the second conductive layer 60 can be formed by depositing a polysilicon layer, and implanting the polysilicon layer with a dopant to reduce the resistance thereof. In addition, the second conductive layer 60 can include a low resistance material on the polysilicon layer. For example, a tungsten silicide (WSi$_x$) layer can be provided on the polysilicon layer to reduce the resistance of the gate electrode.

In particular, the polysilicon layer can have a thickness of approximately 1,500 Angstroms, and the polysilicon layer can be formed by low pressure chemical vapor deposition (LPCVD). In addition, the polysilicon layer can be implanted to provide a surface resistance of approximately 55 ohms/cm$^2$. Preferably, the tungsten silicide layer has a thickness of approximately 1,500 Angstroms, and the tungsten silicide layer can be formed by plasma enhanced chemical vapor deposition (PECVD).

The insulating layer 58 can include an oxide layer having a thickness of approximately 80 Angstroms, a nitride layer, and a second oxide layer having a thickness of approximately 40 to 50 Angstroms. The first oxide layer having a thickness of approximately 80 Angstroms can be formed on the first conductive layer using a technique such as dry oxidation. The nitride layer can be formed on the first oxide layer using low pressure chemical vapor deposition. The second oxide layer can be formed on the nitride layer opposite the first oxide layer using a wet oxidation technique. In addition, the insulating layer 58 can be defined on the first conductive layer 56 and on the resistor layer 56b by patterning the insulating layer 58 before the second conductive layer 60 is formed.

Figure 3C:
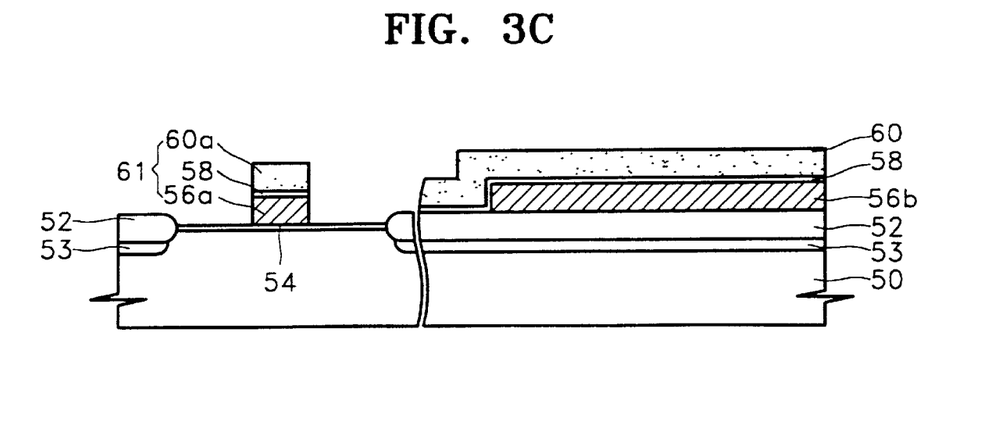

As shown in FIG. 3C, the gate 61 is formed in the memory cell region by patterning the conductive layers 56 and 60 and the insulating layer 58. As shown, the gate 61 includes a control gate 60a, an insulating layer 58, and the floating gate 56a. The gate 61 is formed by etching the second conductive layer 60, the insulating layer 58, and the first conductive layer 56 in the memory cell region using the photoresist pattern 62 as an etching mask. As shown, layers in the peripheral circuit region are not etched because the photoresist pattern 62 covers the peripheral circuit region.

Figure 3D:
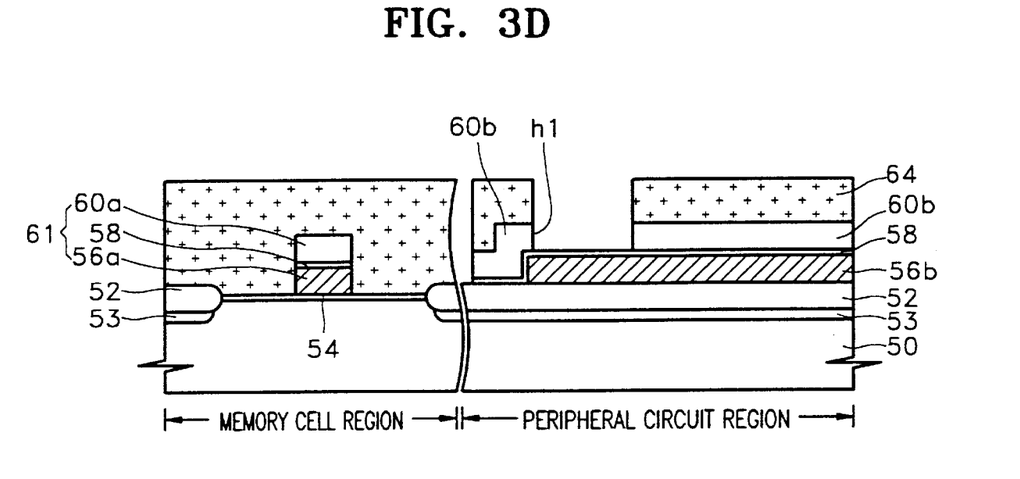

A first contact hole $h_1$ is formed in the capping layer 60b as shown in FIG. 3D. The photoresist pattern 64 covers the memory cell region and portions of the peripheral circuit region while exposing a portion of the capping layer 60b. The photoresist pattern 64 can be formed by coating photoresist on the surface of the wafer and by patterning the photoresist using a photolithography step. As shown, the memory cell region is covered with the photoresist pattern 64. In addition, the photoresist pattern 64 extends beyond the edges of the resistor layer 56b so that the later formed capping layer 60b covers the resistor layer including sidewalls thereof. An opening in the photoresist pattern 64 defines a first contact hole $h_1$ in the capping layer 60b.

The second insulating layer 60 is then patterned using the photoresist pattern 64 as an etching mask to thereby form the capping layer 60b. As shown, the thus formed capping layer 60b has a surface area greater than that of the resistor layer 56b. The capping layer thus extends beyond the edges of the resistor layer 56b. In addition, the first contact hole $h_1$ partially exposes the insulating layer 58 on the resistor layer 56b. In addition, a gate of a peripheral circuit transistor can be simultaneously formed.

The capping layer 60b is provided to maintain a resistance of the resistor layer 56b at a constant value. In particular, the resistance of the resistor layer 56b can be determined by a prior doping step. The capping layer 60b can reduce the diffusion of dopants from other layers into the resistor layer 56b. For example, the capping layer 60b can be used to reduce diffusion from an oxide layer such as a BPSG layer into the resistor layer during later manufacturing steps. In addition, the capping layer 60b can be used to reduce additional doping of the resistor layer 60b when implanting contact regions thereof through the contact hole $h_1$ and when doping source and drain regions of the memory cell transistor.

As discussed above, the capping layer 60b has a surface area greater than that of the resistor layer 56b so that the sidewalls of the resistor layer 56b are covered. Accordingly, the generation of stringers on the sidewalls of the resistor layer 56b can be reduced when patterning the capping layer.

Figure 3E:
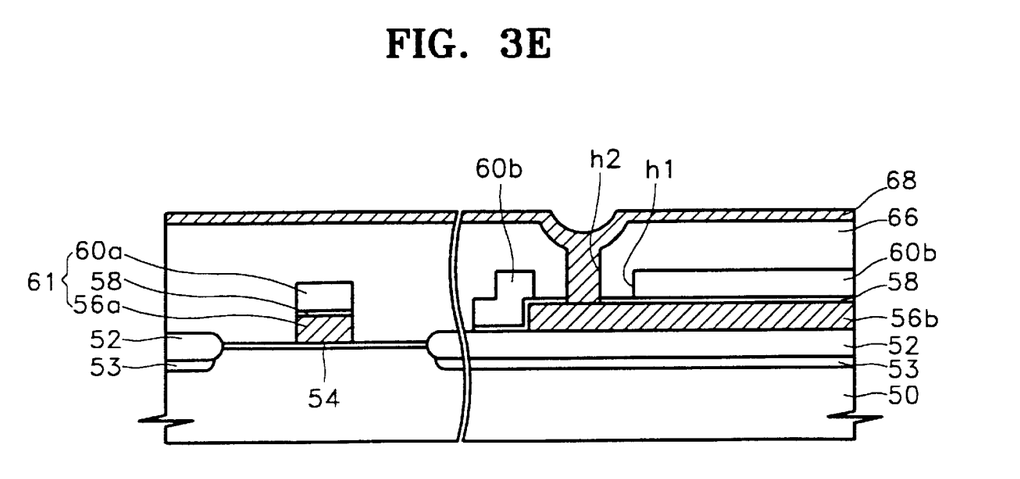

After removing the second photoresist pattern 64, source and drain regions of the memory cell transistor and a peripheral circuit transistor can be formed by implanting dopant ions into the substrate. Accordingly, the portion of the resistor layer 56b exposed through the contact hole $h_1$ may also be implanted. The remaining portions of the resistor layer 56b, however, are masked by the capping layer 60b. The planarization layer 66 can then be formed by depositing an insulating material such as an oxide on the memory cell and peripheral circuit regions. The planarization layer 66 can then be planarized using a thermal treatment to provide a relatively planar surface. The second contact hole $h_2$ can then be formed in the planarization layer thereby exposing a sub-portion of the resistor layer 56b through the first contact hole $h_1$. The contact hole $h_2$ can be formed using photolithography and etch steps. The metal layer 68 is then formed on the planarization layer 66, and this metal layer is electrically connected to the resistor layer 56b through the second contact hole $h_2$. In particular, the metal layer 68 can be formed by depositing a layer of a conductive material such as aluminum and patterning the conductive layer.

As shown, it is preferable to form the second contact hole $h_2$ through the first contact hole $h_1$. Step coverage can be improved by forming an upper end portion of the contact hole $h_2$ to be wider than a lower end portion. This structure can be obtained by using a combination of wet and dry etches. The planarization layer 66 can be formed by depositing a layer of an oxide such as a high temperature oxide (HTO) having a thickness of approximately 1,000 Angstroms. A flowable insulating material can then be formed on the high temperature oxide and reflowed to provide planarization. In particular, a doped oxide such as BPSG having a thickness of approximately 6,000 Angstroms can be used to provide the flowable insulating material. The metal layer 68 is preferably a layer of aluminum having a thickness of approximately 8,000 Angstroms.

According to the structure of FIG. 1, the capping layer is large enough to cover the sidewalls of the resistor layer 56b. Accordingly, the capping layer 60b can be used to maintain a predetermined resistance of the resistor layer 56b. In addition, the generation of stringers of the capping layer on sidewalls of the resistor layer 56b can be reduced during an anisotropic etch used to pattern the capping layer 60b. In addition, misalignment margins can be improved because the control gate 56a and the floating gate 60a are formed during a single photolithography step.

FIGS. 4A through 4D are cross-sectional views illustrating steps of a method for forming the non-volatile memory device of FIG. 2. In FIGS. 4A through 4D, the generation of capping layer stringers on the sidewalls of the resistor layer is reduced by patterning the resistor layer and the capping layer with a single etching step.

Figure 4A:
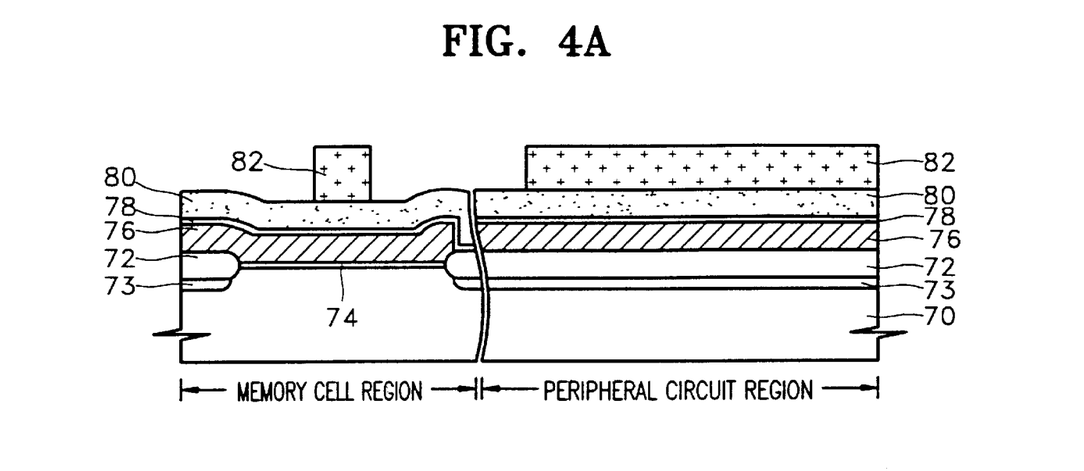
FIGS. 4A to 4D are cross sectional views illustrating steps of a method for forming a non-volatile memory device according to FIG. 2.

As shown in FIG. 4A, a field oxide layer 72 and a gate oxide layer 74 are formed on the semiconductor substrate 70. In particular, the gate oxide layer 74 is formed on portions of the memory cell region exposed by the field oxide layer 72. In addition, a channel stopping region 73 can be provided beneath the field oxide layer 72. In addition, a first conductive layer 76 is formed on the gate and field oxide layers, an insulating layer 78 is formed on the first conductive layer 76, and a second conductive layer 80 is formed on the insulating layer 78. The first conductive layer 76 will be patterned to provide a floating gate in the memory cell region and a resistor layer in the peripheral circuit region. The first conductive layer can be formed by depositing a conductive material as discussed above with regard to FIG. 4A. This first conductive layer can be patterned in the memory cell region at this point if the peripheral circuit region is covered with an etching mask.

The insulating layer 78 and the second conductive layer 80 are formed on the first conductive layer 76. The photoresist pattern 82 is then formed on the second insulating layer 80 by coating a layer of photoresist and patterning the photoresist coating. The photoresist pattern 82 defines portions of the memory cell region where the gate is to be formed, and the photoresist pattern 82 also defines portions of the peripheral circuit region where the resistor layer is to be formed.

In addition, a channel stop layer 73 may be provided under the field oxide layer 72 by implanting dopant ions therein. The dopant ions can be implanted before the formation of the field oxide layer. Alternately, the dopant ions can be implanted after forming the field oxide layer. In addition, the first conductive layer preferably has a predetermined surface resistance determined by implanting dopant ions into the first conductive layer.

Figure 4B:
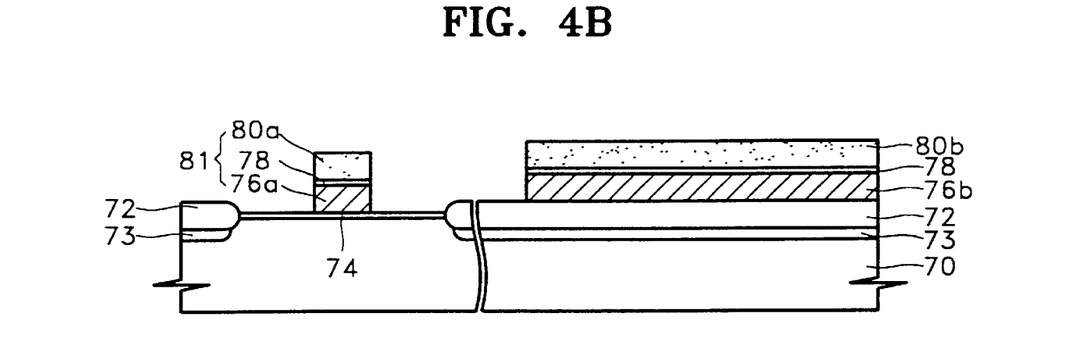

The memory cell transistor gate 81, the resistor layer 76b, and the capping layer 80b can thus be patterned simultaneously as shown in FIG. 4B. In particular, the second conductive layer 80, the insulating layer 78, and the first conductive layer 76 can be sequentially etched using the photoresist pattern 82 as an etch mask. The photoresist pattern 82 can then be removed. Accordingly, a memory cell transistor gate 81 including a control gate 80a, an insulating layer 78, and a floating gate 76a can be formed in the memory cell region. In addition, a resistor layer 76b, an insulating layer 78, and a capping layer 80b can be formed in the peripheral circuit region.

Capping layer stringers can thus be reduced because the resistor layer 76b and the capping layer 80b are formed simultaneously using a single etch mask. Again, the capping layer 80b reduces undesired doping of the resistor layer, and the capping layer has a surface area equal to that of the resistor layer thereby covering the resistor layer. Stated in other words, the sidewalls (edges) of the capping layer coincide with the sidewalls (edges) of the resistor layer.

Figure 4C:
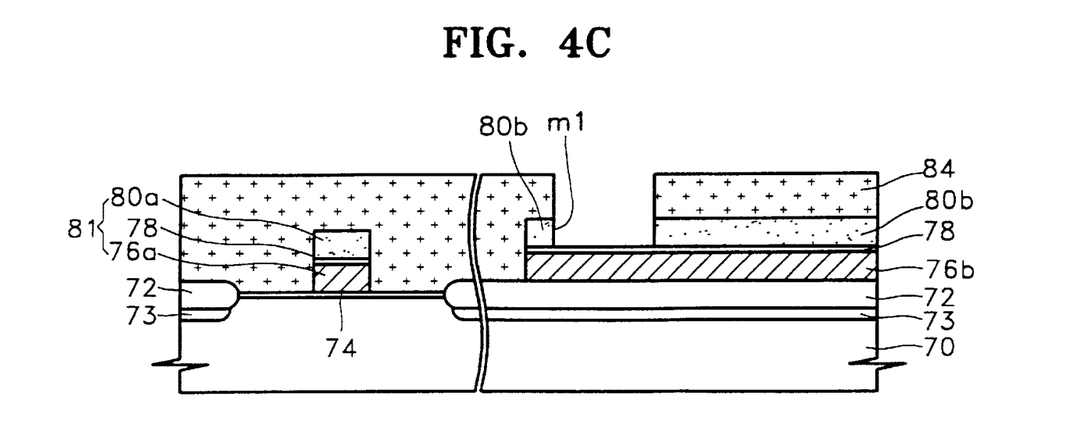

A first contact hole $m_1$ is formed in the capping layer 80b as shown in FIG. 4C. In particular, a photoresist pattern 84 is formed over the memory cell and peripheral circuit regions. This photoresist pattern can be formed by coating a layer of photoresist and patterning the photoresist coating. As shown in FIG. 4C, the photoresist pattern 84 exposes a portion of the capping layer 80b wherein the first contact hole is to be formed. In addition, the photoresist pattern 84 can be used to define a peripheral circuit gate. The first contact hole $m_1$ is formed by etching the portion of the capping layer 80b exposed by the photoresist pattern 84. A gate of a peripheral circuit transistor can be formed simultaneously.

After removing the photoresist pattern 84, source and drain regions of the memory cell transistor and peripheral circuit transistors can be formed by implanting dopant ions into the substrate. In addition, this implant step can be used to dope the portion of the resistor layer 76b exposed by the first contact hole $m_1$. As before, the capping layer can reduce undesired doping of the resistor layer 76b during this implant step.

Figure 4D:
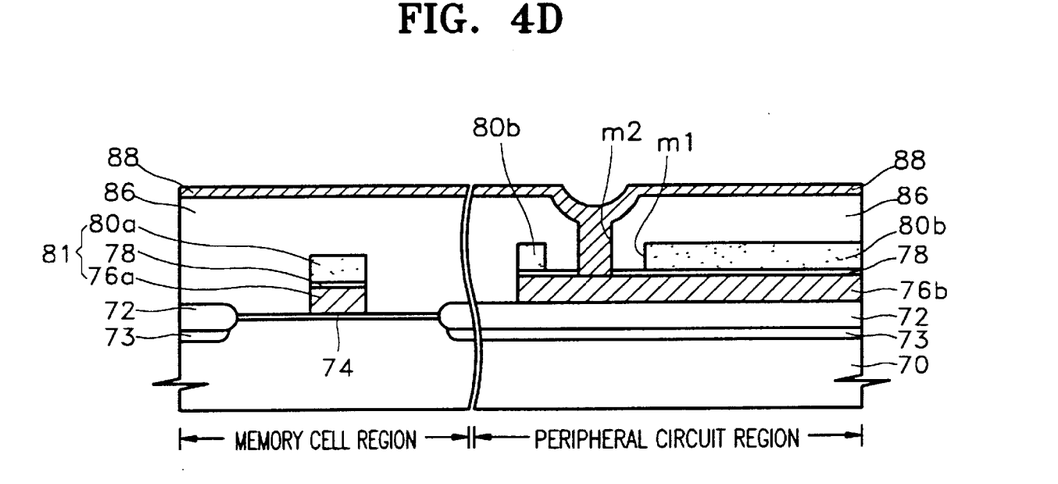

A planarization layer 86 is then formed by depositing an insulating material such as an oxide and performing a planarization process, as shown in FIG. 4D. The second contact hole $m_2$ is formed in the planarization layer 86 by selectively etching the planarization layer and the insulating layer 78. The metal layer 88 is then formed on the planarization layer 86, and this metal layer 88 is connected to the resistor layer 76b through the contact holes $m_1$ and $m_2$. The metal layer 88 can be formed from a layer of a conductive material such as aluminum, and this conductive layer can be patterned using photolithography and etch steps. The steps and materials used to form the second contact hole $m_2$, the planarization layer 86, and the metal layer 88 are the same as those discussed above with regard to FIGS. 3A through 3E.

According to the methods and structures discussed above with regard to FIGS. 4A through 4D, the resistor layer 76b and the capping layer 80b can be formed simultaneously using a single etch mask. Capping layer stringers on the sidewalls of the resistor layer can thus be reduced during an anisotropic etch used to form the capping layer. In addition, misalignment margins of the gate structure can be improved as discussed above with regard to FIGS. 3A through 3E.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A non-volatile memory device comprising:
   a substrate having memory cell and peripheral circuit regions thereof;
   a non-volatile memory cell gate on said memory cell region of said substrate, wherein said non-volatile memory cell gate includes a floating gate on said substrate, a first insulating layer on said floating gate opposite said substrate, and a control gate on said first insulating layer opposite said floating gate;

a resistor layer on said peripheral circuit region of said substrate;

a second insulating layer on said resistor layer opposite said substrate; and a capping layer on said second insulating layer opposite said resistor layer wherein a contact hole is defined by said second insulating layer and said capping layer exposing a portion of said resistor layer.

2. A non-volatile memory device according to claim 1 wherein said capping layer extends completely across said resistor layer so that said capping layer covers said resistor layer to edge portions thereof except for said portion of said resistor layer exposed by said contact hole.

3. A non-volatile memory device according to claim 1 wherein said capping layer extends completely across said resistor layer and edge portions thereof so that said capping layer covers said resistor layer and sidewalls thereof except for said portion of said resistor layer exposed by said contact hole.

4. A non-volatile memory device according to claim 1 further comprising:

a third insulating layer on said capping layer opposite said second insulating layer wherein said third insulating layer defines a second contact hole therein through said first contact hole exposing a sub-portion of said exposed portion of said resistor layer; and a metal layer on said third insulating layer opposite said capping layer wherein said metal layer is electrically connected to said resistor layer through said contact hole.

5. A non-volatile memory device according to claim 1 wherein said capping layer extends beyond said resistor layer thereby covering sidewalls of said resistor layer.

6. A non-volatile memory device according to claim 1 wherein edges of said capping layer coincide with edges of said resistor layer.

7. A non-volatile memory device according to claim 1 wherein said floating gate layer and said resistor layer comprise doped polysilicon layers having a common resistivity and a common thickness.

8. A non-volatile memory device according to claim 1 wherein said first and second insulating layers each comprise oxide/nitride/oxide (ONO) layers.

9. A non-volatile memory device according to claim 1 wherein said control gate layer and said capping layer comprise doped polysilicon layers having a common resistivity and a common thickness.

10. A non-volatile memory device according to claim 9 wherein said control gate layer and said capping layer further comprise metal silicide layers on said doped polysilicon layers.

* * * * *